United States Patent
Burssens et al.

(10) Patent No.: US 10,539,632 B2
(45) Date of Patent: Jan. 21, 2020

(54) SENSOR DEVICE WITH A SOFT MAGNETIC ALLOY HAVING REDUCED COERCIVITY, AND METHOD FOR MAKING SAME

(71) Applicant: Melexis Technologies SA, Bevaix (CH)

(72) Inventors: Jan-Willem Burssens, Tielt-Winge (BE); Robert Racz, Zug (CH)

(73) Assignee: Melexis Technologies SA, Bevaix (CH)

( * ) Notice: Subject to any disclaimer, the term of this patent is extended or adjusted under 35 U.S.C. 154(b) by 131 days.

(21) Appl. No.: 15/660,337

(22) Filed: Jul. 26, 2017

(65) Prior Publication Data
US 2018/0031645 A1    Feb. 1, 2018

(30) Foreign Application Priority Data
Jul. 26, 2016   (EP) .................... 16181344

(51) Int. Cl.
   *G01R 33/07*   (2006.01)
   *G01R 33/02*   (2006.01)
   *G01R 33/09*   (2006.01)
   *H01F 10/32*   (2006.01)
   *H01F 41/14*   (2006.01)
   *H01L 43/06*   (2006.01)

(52) U.S. Cl.
   CPC .......... *G01R 33/072* (2013.01); *G01R 33/02* (2013.01); *G01R 33/091* (2013.01); *H01F 10/32* (2013.01); *H01F 41/14* (2013.01); *H01L 43/06* (2013.01)

(58) Field of Classification Search
   CPC .............. G01R 33/072; G01R 33/0052; G01R 33/0011; G01R 33/02; G01R 33/091; H01L 43/06; H01F 10/32; H01F 41/14
   See application file for complete search history.

(56) References Cited

U.S. PATENT DOCUMENTS 5,942,895 A  *  8/1999  Popovic .................. G01R 33/07
                                                      324/117 H
6,545,462 B2     4/2003  Schott et al.
                      (Continued)

FOREIGN PATENT DOCUMENTS

EP      1182461 A2     2/2002
EP      2814065 A2     12/2014

OTHER PUBLICATIONS

Schott et al., Smart CMOS sensors with integrated magnetic concentrators, Sensors, 2005 IEEE, 2005 (Year: 2005).*
(Continued)

*Primary Examiner* — Daniel R Miller
(74) *Attorney, Agent, or Firm* — Workman Nydegger

(57) ABSTRACT

A sensor device comprising a substrate, the substrate comprising one or more magnetic sensor elements; a first elastomeric material on top of the one or more magnetic sensor elements; a magnetic layer comprising a soft magnetic metal alloy deposited by electroplating or by sputtering on top of the first elastomeric material; and optionally a second elastomeric material on top of the magnetic layer. The substrate may be a CMOS device with IMC encapsulated between two polyimide layers. The magnetic material may be annealed at 250° C. to 295° C. using a constant or rotating magnetic field having a strength in the range from 100 to 300 mTesla. The soft magnetic alloy is arranged as Integrated Magnetic Concentrator (IMC).

14 Claims, 4 Drawing Sheets

(56) References Cited

U.S. PATENT DOCUMENTS

| | | |
|---|---|---|
| 6,734,671 B2 | 5/2004 | Murata et al. |
| 2002/0021124 A1 | 2/2002 | Schott et al. |
| 2003/0197211 A1 | 10/2003 | Bhattacharyya et al. |
| 2004/0042129 A1 | 3/2004 | Mizuguchi et al. |
| 2008/0001207 A1* | 1/2008 | Guo ................ G11C 11/15 257/316 |
| 2014/0367813 A1* | 12/2014 | Ryu ................ H01L 43/04 257/421 |

OTHER PUBLICATIONS

European Search Report from EP Application No. 16181344.9, dated Jan. 23, 2017.

* cited by examiner

SENSOR DEVICE WITH A SOFT MAGNETIC ALLOY HAVING REDUCED COERCIVITY, AND METHOD FOR MAKING SAME

FIELD OF THE INVENTION

The present invention relates to the field of magnetic sensors and methods for making such magnetic sensors. More particularly, the present invention relates to a magnetic sensor having a reduced hysteresis, and methods for making such sensors.

BACKGROUND OF THE INVENTION

Magnetic sensors can be used in a wide field of applications. One exemplary application of magnetic sensors is as an angle sensor for controlling a motor. Magnetic sensors can be used for determining a quantity and/or a direction of a magnetic field.

Several magnetic sensor designs have been developed. One interesting design of a magnetic sensor is based on a semiconductor substrate comprising magnetically sensitive regions obtained by embedding magnetic sensing elements in the semiconductor substrate in the form of so called "Horizontal Hall elements", and by arranging a magnetic substance on top of the semiconductor substrate for bending the magnetic flux from a horizontal direction (parallel to the surface of the semiconductor substrate) towards a vertical direction (perpendicular to said surface). Such magnetic substance, arranged in the vicinity of magnetic sensing elements for bending magnetic field lines, are known in the art as "Integrated Magnetic Concentrator", abbreviated as IMC, and is described for example in EP1182461 and EP2814065.

A problem of magnetic material is that it has a hysteresis (related to magnetic coercivity) which causes inaccuracies of magnetic field strength measurements. There is a need to reduce the coercivity of the magnetic material.

SUMMARY OF THE INVENTION

It is an object of embodiments of the present invention to provide a sensor device comprising a soft magnetic alloy with a reduced coercivity, and a method of manufacturing such a sensor device.

These objectives are accomplished by a device and a method according to embodiments of the present invention.

In a first aspect, the present invention provides a sensor device comprising: a substrate comprising one or more magnetic sensor elements; a first elastomeric material on top of the substrate; a magnetic layer comprising a soft magnetic metal alloy deposited by electroplating or by sputtering on top of the first elastomeric material; a second elastomeric material on top of the magnetic layer.

The "substrate comprising one or more magnetic sensor elements" can for example be a substrate with incorporated magnetic sensor elements, or can for example be a substrate with magnetic sensor elements mounted thereto.

The first elastomeric material may be deposited on top of the one or more magnetic sensor elements, or adjacent to these sensor elements.

The one or more magnetic sensor elements may be separate Hall elements such as transfer printed elements, or may be sensor elements embedded or integrated in the substrate. The substrate may be a semiconductor substrate, or a substrate made of another material.

It is an advantage of applying a first elastomeric material or elastomeric compound between the semiconductor material and the magnetic alloy, because this reduces the mechanical stress exerted on the magnetic sensor elements, e.g. Hall elements, but especially because it also reduces the mechanical stress exerted upon the magnetic alloy. As is known in the art, reducing mechanical stress exerted upon the Hall elements can decrease a voltage offset error. According to an insight of the present invention, reducing mechanical stress of the magnetic alloy was found to reduce the coercivity. The inventors are of the strong opinion that the latter effect is either not known in the art, or at least not recognized as having a significant influence on coercivity, in contrast to grain size.

It is a particular advantage of applying a second elastomeric material on top of the soft magnetic metal alloy in such a way that the magnetic alloy is completely surrounded or encapsulated in or between elastomeric materials. This is particularly intended to further reduce the stress exerted upon the magnetic alloy itself, inter alia by the package.

Although not absolutely required, it is an advantage if the second elastomeric material or compound is the same as the first elastomeric material or compound, because then the layer above and below the magnetic material have the same thermal behaviour.

It was found that encapsulating the magnetic material can reduce the shear stresses in the magnetic material with several magnitudes.

Particularly, reducing stress in the magnetic material may avoid and/or reduce stress-induced changes of magnetic hysteresis (e.g. related to magnetic coercivity), and thus avoid and/or reduce inaccuracies of magnetic field strength measurements of the sensor device.

Furthermore, a soft magnetic alloy forms an integrated magnetic concentrator in a device in accordance with embodiments of the present invention. The encapsulation of this soft magnetic alloy in accordance with embodiments of the present invention can avoid and/or reduce changes in relative alignment between the integrated magnetic concentrator and the sensing element, and/or changes in the magnetic field alignment properties of the integrated magnetic concentrator with respect to the sensing element due to stresses, e.g. internal stresses in the soft magnetic alloy, such that, advantageously, a stable and robust signal transduction can be achieved by embodiments of the present invention.

The sensor device is preferably a semiconductor device, for example an integrated semiconductor device, or a packaged semiconductor device.

The soft magnetic alloy is arranged, e.g. configured, e.g. adapted in shape, dimensions and location, as Integrated Magnetic Concentrator. The magnetic layer may function as an integrated magnetic concentrator, known per se in the art as "IMC".

In an embodiment, the substrate comprises one or more embedded sensor elements, and wherein the soft magnetic alloy is arranged as Integrated Magnetic Concentrator.

In an embodiment, the magnetic sensor elements may be embedded in the substrate to form horizontal Hall elements, and the soft magnetic alloy may be configured and arranged to bend the magnetic flux from a horizontal direction parallel to the surface of the substrate towards a vertical direction perpendicular to said surface in the vicinity of the magnetic sensor elements.

The substrate may be a CMOS device. CMOS technology is the technology of choice for high volume applications, and allows to integrate further functions, such as analogue or digital filtering, analogue or digital processing, etc. In particular embodiments where the CMOS device also comprises a programmable processor, the sensor device is a "smart sensor device".

In an embodiment, the first and/or second elastomeric material or compound is selected from the group consisting of polyimide, PDMS, PBO, WPR, epoxy.

It is an advantage of using polyimide because it is a well-known and standard material, capable of withstanding high temperatures. Polyimide has very good elastic, and was found to reduce the stress on the magnetic material considerably.

But the invention is not limited to the use of polyimide, and other materials such as e.g. PDMS, PBO, WPR, epoxy can also be used, because they also have a low stiffness which causes a decoupling of the magnetic alloy from the rest of the semiconductor device, in particular the package.

In an embodiment, the soft magnetic alloy is an Fe—Ni alloy or a Co—Ni alloy or an Fe—Co—Ni or an Fe—Co alloy or an Fe—Si alloy.

It is an advantage of a CoNi alloy that such alloy can be easily electroplated.

The Fe—Ni alloy may comprise at least 95% of Fe and Ni atoms, and at most 5% other atoms.

For the Fe—Ni, Fe—Co—Ni and Fe—Co alloys, preferably the concentration of Fe lies in the range from 10 to 30% by weight, for example in the range from 19 to 25% by weight, or even 19 to 22% by weight. The coercivity of such an alloy is low and the permeability high.

Optionally the alloy may further comprise at least 1% by weight Molybdenum, which may reduce the temperature dependence of the coercivity.

According to a second aspect, the present invention provides a method of producing a sensor device, comprising the steps of: a) providing a substrate comprising one or more magnetic sensor elements; b) depositing a first elastomeric material on top of the one or more magnetic sensor elements; c) applying a magnetic layer comprising a soft magnetic metal alloy on top of the first elastomeric material by electroplating or by sputtering.

It is an advantage of depositing magnetic alloy by sputtering or electroplating, because this allows to produce a very thin layer, in contrast to for example producing a magnetic layer as a separate structure, which is subsequently glued or otherwise connected to the substrate.

It is an advantage of applying a first elastomeric material or elastomeric compound between the semiconductor material and the magnetic alloy, because this reduces the mechanical stress exerted on the magnetic sensor elements, e.g. Hall elements, but especially because it also reduces the mechanical stress exerted upon the magnetic alloy. As is known in the art, reducing mechanical stress exerted upon the Hall elements can decrease a voltage offset error. According to an insight of the present invention, reducing mechanical stress of the magnetic alloy was found to reduce the coercivity. The inventors are of the strong opinion that the latter effect is either not known in the art, or at least not considered or recognized as having a significant influence on coercivity, in contrast to grain size.

The method further comprises a step d) following step b), and before or after step c) of: d) depositing a second elastomeric material on top of the magnetic layer.

The step c) comprises arranging the soft magnetic alloy as Integrated Magnetic Concentrator (IMC). The substrate may be a CMOS device.

It is an advantage of applying a second elastomeric material or elastomeric compound on top of the magnetic layer, because it is particularly advantageous to completely surround or encapsulate the magnetic material in or between elastomeric material. This is particularly intended to further reduce the stress exerted upon the magnetic alloy itself, inter alia by the package. As mentioned above, the inventors are of the opinion that the impact of mechanical stress on the coercivity of the soft magnetic material is not recognized as being significant, hence the proposed solution, based on this new insight, is believed to be inventive. It was found that encapsulating the magnetic material can reduce the shear stresses in the magnetic material with several magnitudes.

Although not absolutely required, it is an advantage if the second elastomeric material or compound is the same as the first elastomeric material or compound, because then the layer above and below the magnetic material have the same thermal behaviour.

In an embodiment, step a) may comprise providing a substrate comprising one or more embedded sensor elements to form horizontal Hall elements.

In an embodiment, step c) may comprise arranging and configuring the soft magnetic alloy to bend the magnetic flux from a horizontal direction parallel to the surface of the substrate towards a vertical direction perpendicular to said surface in the vicinity of the magnetic sensor elements.

In an embodiment, step b) comprises providing a material or compound selected from the group consisting of polyimide, PDMS, PBO, WPR, epoxy as the first elastomeric material.

In an embodiment, step d) comprises providing a material or compound selected from the group consisting of polyimide, PDMS, PBO, WPR, epoxy as the second elastomeric material.

In an embodiment, step a) comprises providing a substrate comprising one or more magnetic sensor elements and a conductive layer to be electroplated; and step c) comprises applying the magnetic layer by electroplating.

Optionally a liquid comprising boric acid is used for co-deposition of Boron. Co-deposition of Boron may reduce the coercivity even further.

Optionally the magnetic layer is applied by co-depositing ferrite particles and/or ferrite nanoparticles, such as for example $FeFeO3$ or $ZnFeO3$.

Co-deposition of ferrite particles or ferrite nanoparticles may reduce the coercivity even further, and may reduce variations of coercivity as a function of temperature.

In an embodiment, step c) comprises applying the magnetic layer by sputtering.

In an embodiment, the method further comprises a step e) following step c), and before or after step d) of: e) annealing the substrate with the magnetic layer at a temperature in the range from 250° C. to 370° C. for a duration in the range of 10 minutes to 24 hours in the presence of a magnetic field having an intensity that at least partially saturates the soft magnetic metal alloy.

It is a major advantage of the annealing step under the stated conditions that it provides a semiconductor device having an integrated Magnetic Concentrator with a reduced coercivity.

It was surprisingly found during experiments that annealing at said temperature in the presence of a magnetic field with such intensity but for such a duration had the effect of reducing the coercivity significantly. As far as is known to the inventors, no prior art document discloses that annealing in a magnetic field at such low temperature for such a long time has an influence on coercivity. There seems to be a common believe that coercivity should and can only be reduced by reducing the grain size.

Experiments with FeNi alloy using annealing in a stationary magnetic field have shown that the coercivity may be reduced by a factor of about 2 as compared to annealing in the absence of such field, and by a factor of about 5 when annealing with a rotating magnetic field. That is a major improvement, and significantly improves accuracy of magnetic field measurements. Devices produced in this way are ideally suited for current sensing applications.

The magnetic sensor elements may comprise or consist of one or more Hall elements, e.g. Horizontal Hall elements and/or vertical Hall elements.

In an embodiment, step e) comprises annealing at a temperature in the range from 250° C. to 295° C. for a duration in the range from 3 hours to 24 hours, using a magnetic field strength in the range from 100 mTesla to 300 mTesla.

The value of 100 to 300 mTesla is about the spontaneous magnetisation field times the aspect ratio.

It is an advantage of this method that a lower temperature can be used, albeit that a longer duration may be required to obtain the same effect.

In an embodiment, step e) comprises annealing in the presence of a constant magnetic field, Such a field can be created for example by means of one or more coils where a constant current is injected, or can be created for example by a permanent magnet.

In an embodiment, step e) comprises annealing in the presence of a magnetic field that is rotating relative to the substrate.

Such a field can be created for example by means of a plurality of coils where currents are dynamically switched, or can be created for example by physically rotating the CMOS device relative to a coil where a constant current flows, or can be created for example by physically rotating the CMOS device relative to a permanent magnet.

In an embodiment, step e) comprises generating the magnetic field by means of one or more permanent magnets, and rotating the substrate with the magnetic alloy relative to the one or more permanent magnets, or vice versa.

It is an advantage of using at least one permanent magnet for creating the magnetic field, and physically rotating the substrate relative to the at least one permanent magnet, or vice versa, as opposed to creating a varying magnetic field using coils and switched currents, in view of the relatively high currents required to generate a strong magnetic field that at least partially saturates the magnetic alloy, and in view of the relatively long duration of the annealing step and the associated equipment and energy cost.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
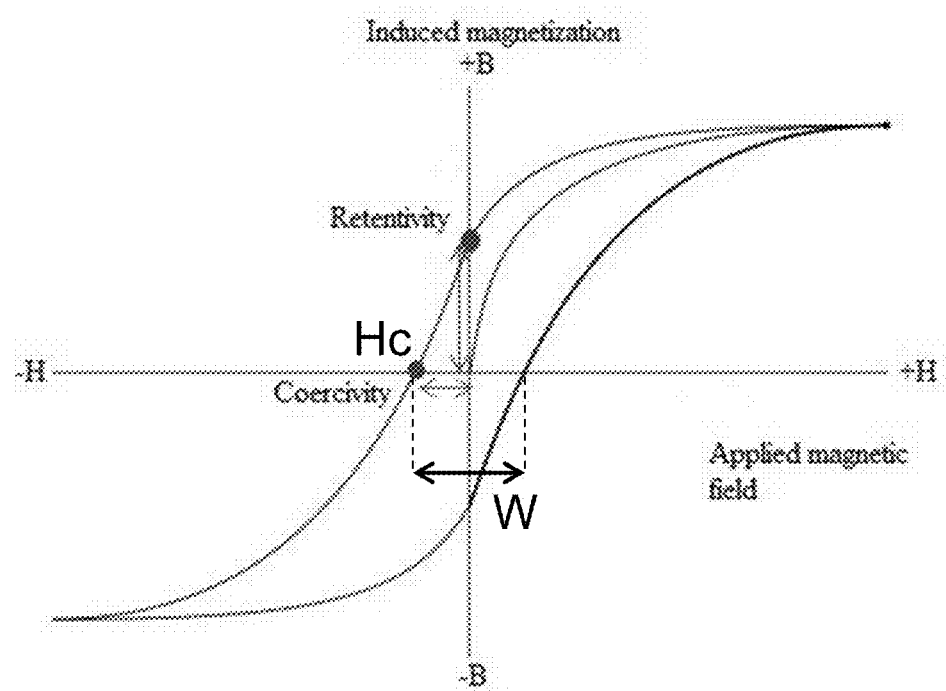
FIG. 1 shows a typical hysteresis-curve of a soft-magnetic material, known in the art.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the present invention, the terms "coercivity" is used in its usual meaning, and refers to a material property, in particular to the magnetic-field strength necessary to demagnetize a ferromagnetic material that is magnetized to saturation. It is measured in amperes per meter [A/m], and typically indicated by symbol "Hc", and is represented by the intersection of the hysteresis-curve and the horizontal (H) axis in a BH-plot.

The term "soft magnetic" and "hard magnetic" have a well recognized meaning in the art.

In the present invention, with "sensor offset" is meant a measurement value of the remanent field due to the hysteresis of the magnetic material(s).

The inventors of the present invention were confronted with the task of reducing the hysteresis of a sensor device, e.g. a CMOS device comprising an integrated magnetic concentrator (IMC) on top.

Searching for a solution in literature, they found many documents consistently stating that in order to reduce coercivity, the grain size of the magnetic material needs to be reduced. Experiments confirmed that indeed, reducing the grain size helps to reduce the coercivity, but only to a certain limit, beyond which further reducing the grain size doesn't seem to help anymore.

Looking for other ways to potentially reduce the coercivity, the inventors found two techniques that provide surprisingly good results.

(1) A first technique is related to reducing mechanical stress exerted upon the magnetic alloy itself. While it is known in the prior art that deposition of a magnetic alloy (e.g. NiFe alloy) on top of a substrate (e.g. a CMOS substrate with a passivation layer) causes mechanical stress "at the interface", the prior art seems to focus solely on the stress exerted upon the magnetic sensing elements (e.g. Hall elements) and the "voltage offset" caused by such stress, but seems to be completely unaware or completely ignore that stress exerted upon the magnetic alloy has a negative effect on coercivity of the magnetic material. It is therefore firmly believed that this aspect of the present invention is based on a new insight. Once realized, of course, solutions to reduce coercivity by reducing mechanical stress exerted upon the magnetic material can easily be found. The solution proposed in this document is based on at least partly surrounding or encapsulating the magnetic alloy in an elastomeric material or elastomeric compound.

(2) A second technique is related to removing defects from the deposited magnetic material by means of annealing, but in the presence of a magnetic field, for example a constant magnetic field or a magnetic field that is rotating relative to the device.

It is pointed out that the first technique (using an elastomeric material below, or below and above the magnetic alloy) and the second technique (annealing in the presence of a stationary or rotating magnetic field) can be used separately, or in combination. The best results are obtained when both techniques are combined.

Referring now to the drawings.

FIG. 1 shows a typical hysteresis-curve of a soft-magnetic material, as is known in the art. The coercivity Hc of the material is represented by the intersection of the hysteresis-curve and the horizontal (H) axis. The main focus of the present invention is to reduce the width W of the hysteresis curve, or to reduce the coercivity Hc.

Figure 2:
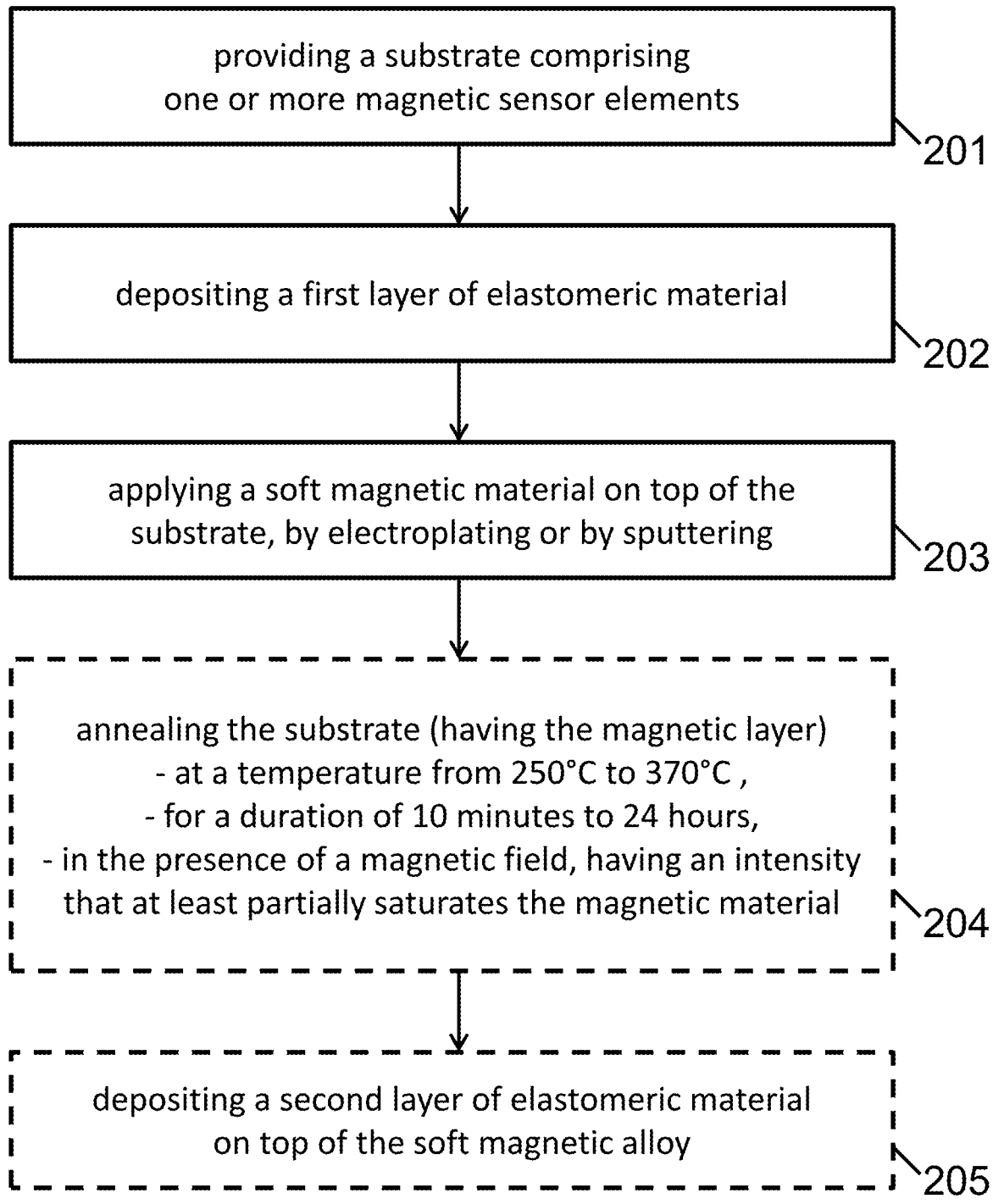
FIG. 2 shows a method of producing a semiconductor device according to the present invention.
Figure 6:
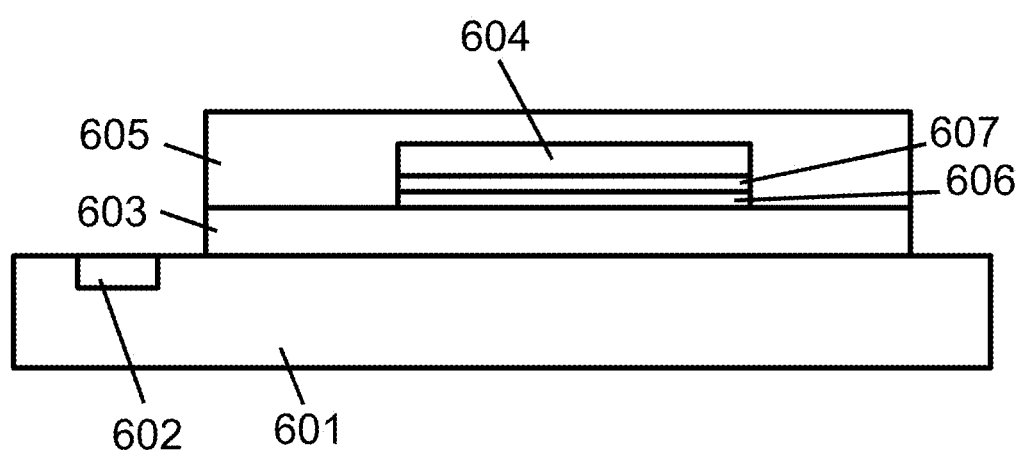
FIG. 6 shows an example of a sensor device according to an embodiment of the present invention, showing that the magnetic layer is encapsulated between two elastomeric layers.

FIG. 2 illustrates a method 200 of producing a semiconductor sensor device 600, and FIG. 6 shows an example of a semiconductor sensor device 600 thus made.

The sensor device 600 comprises a relatively thin layer of a soft magnetic alloy 604, for example having a thickness in the range from 2 µm to 200 µm, for example in the range from 4 µm to 100 µm, for example in the range from 10 µm to 40 µm, for example having a thickness of about 15 µm or about 20 µm or about 25 µm or about 30 µm.

The substrate 601 may be a semiconductor substrate, more in particular, a CMOS device, but the present invention is not limited thereto. The layer of soft magnetic material 604 may be adapted (e.g. shaped and oriented) for acting as Integrated Magnetic Concentrator IMC.

In a first step 201, a substrate 601 comprising one or more magnetic sensor elements 602, e.g. a CMOS device comprising one or more horizontal Hall elements, is provided, but other substrates and other magnetic sensor elements may also be used. Methods of producing substrates comprising one or more magnetic sensor elements, for example CMOS devices comprising one or more horizontal Hall elements, are well known in the art, and hence need not be described in more detail here. Suffice it to say the CMOS device typically has a passivation layer on top, for example comprising or consisting of silicon oxide or silicon nitride. But the invention also works for other semiconductor devices, such as e.g. based on Ge or GaAs, the invention not being limited thereto.

In step 202, a first layer or an elastomeric material 603 or elastomeric compound is deposited on top of the substrate 601. The elastomeric material need not be deposited directly on top of the substrate, but there may be one or more intermediate layers in between. The first elastomeric material 603 may be polyimide, but other elastomeric materials or compound that have a relatively low stiffness or a relatively high elasticity can also be used. Examples of other suitable materials are: PDMS, PBO, WPR, epoxy, silicone, etc.

An advantage of using polyimide is that polyimide is a highly elastic layer, is available as standard spin-on and tape materials, and able to withstand high temperature bake steps. An advantage of PBO is that it has less water absorption.

In step 203, a magnetic layer comprising a soft magnetic metal alloy 604 is applied on top of the substrate 601, preferably on top of the elastomeric material or compound 603, preferably by electroplating or by sputtering. In this way a thin layer of a soft magnetic material 604 can be deposited on top of the substrate. An advantage of electroplating is that it provides very fine grain size structures, and that it allows building of relatively thick layers. Alternatively sputtering can also be used, but it typically requires more time to build a thick layer. Suitable magnetic alloys are for example: an FeNi alloy, an FeCoNi alloy, an FeCo alloy, or a CoNi alloy.

In optional step 204, the structure comprising the substrate 601 and the first elastomeric layer 603 and the magnetic layer 604 is annealed at a temperature in the range from 250° C. to 370° C. for a duration in the range from 10 minutes to 24 hours, in the presence of a magnetic field having an intensity that at least partially saturates the soft magnetic metal alloy 604.

In optional step 205, a second layer of elastomeric material or elastomeric compound 605 is deposited on top of the soft magnetic alloy 604, so as to at least partly, but preferably completely cover or encapsulate the soft magnetic material 604. It was found that this reduces mechanical stress exerted upon the magnetic material itself (rather than the stress exerted upon the Hall elements), and also that this reduces the temperature dependency of the coercivity. It is noted that step 204 (annealing) can be performed before step 205 (deposition of the second elastomeric layer) as shown in FIG. 2, or after step 205. In other words, the order of step 204 and step 205 can be swapped.

Preferably in step 203 a NiFe alloy is deposited, for example having a composition Ni(100−x)Fe(x) with x between a value from 19% to 30%, but the invention is not limited to the use of this range. NiFe has near-zero magnetostriction and very low magnetic crystalline anisotropy. Experiments have shown that, when the magnetic material is virtually mechanically decoupled from its surroundings (by being sandwiched between two elastomeric layers of sufficient thickness, the lower layer having a thickness of at least 1 μm, for example about 4 μm, and the upper layer having a thickness of at least 1 μm, preferably at least 5 μm, or at least 10 μm or at least 15 μm or at least 20 μm, e.g. about 25 μm, the exact composition of the NiFe alloy has no or no significant influence anymore on the coercivity. This offers the advantage of relaxing production tolerances and enables the use of other alloys, with higher magnetostriction.

CoFe alloys may also be used, but has higher spontaneous magnetization and shows higher magnetostriction than NiFe.

It is noted that in practice, one or more additional, e.g. intermediate layers may be applied, such as for example an adhesive layer 606 (e.g. 40 nm sputtered TiW) and an electrically conductive layer 607 (e.g. 200 nm sputtered Cu or Al) in case electroplating process is used to deposit the magnetic material 604. Suitable stacks and techniques for applying such adhesive and seed layers are well known in the art, and hence need not be further described here.

TiW can be easily etched selective to Cu, NiFe and aluminum. Instead of TiW also Ti may be used, but selective etching thereof is less straightforward. Also Nb could be used, but it is a less standard material.

It is an advantage of using Cu as the conductive layer 607 because it has a high electrical conductivity, does not oxidize readily in an aqueous environment, and results in good adhesion with the plated layer, but the invention is not limited to Cu, and other materials may be used as well, for example gold, but Au is more expensive and harder to etch.

The higher the annealing temperature (i.e. closer to the upper limit of 370°), the shorter the duration can be to achieve the same advantageous result. For example, the following table lists a few examples of suitable temperature and duration combinations of step (c), merely as an illustration, the present invention not being limited to these examples.

| Temperature | exemplary duration: |
| --- | --- |
| 250° C. to 275° C. | 12 to 24 hours |
| 275° C. to 295° C. | 3 to 12 hours |
| 295° C. to 305° C. | 1 to 4 hours, e.g. about 2 hours |
| 305° C. to 345° C. | 30 minutes to 4 hours |
| 345° C. to 370° C. | 10 minutes to 30 minutes |

Step 204 is typically performed in an oven which is gradually warmed up (e.g. from about 20° C. to about 295° C.) during a first period (e.g. of about 30 to 60 minutes), then kept at a constant temperature (e.g. at about 295° C.) during a second period (e.g. about 2 hours), and then gradually cooled down during a third period (e.g. about 2 to 3 hours). Thus, the total oven process of this example would require about 4.5 to 6.0 hours, but the invention is not limited to this particular sequence, and other sequences can be used as well. The stationary or rotating magnetic field may be present during the entire sequence, including the warming-up and cooling-down period. However, according to the principles of the present invention, the magnetic field must be present during the "second duration" at which the temperature is kept relatively constant.

In variants of this method, the temperature during the so called "second period" of this example could be varied in the range from 250° C. to 370° C., or any subrange thereof.

In a particular embodiment of the present invention, the annealing is applied at about 290° C. or about 300° C. or about 310° C., during about 1.5 hours or about 2.0 hours or about 2.5 hours, in the presence of a field of about 150 or about 175 or about 200 or about 225 or about 250 mTesla. Although a table explicitly spelling out all 45 combinations: 3 (temperature)×3 (duration)×5 (field strength)=45 combinations, to save space, each of these 45 combinations are deemed explicitly disclosed.

The magnetic sensor element 602 can for example be a so called "Horizontal" Hall element. It is an advantage of using a Horizontal Hall element plus IMC instead of a Vertical Hall element, because the IMC provides passive amplification of the signal (by concentrating the magnetic field lines), and because a Horizontal Hall element is easier to produce, and offers higher sensitivity and lower resistance (thus less thermal noise).

Figure 3:
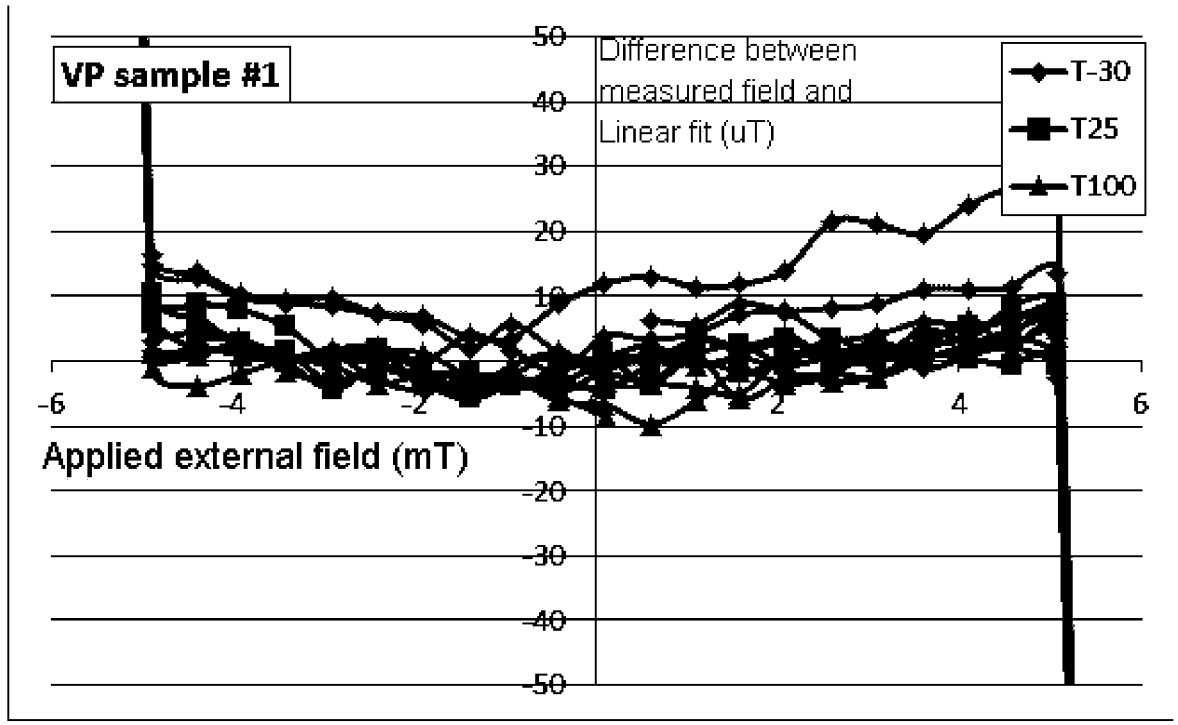
FIG. 3 shows a graph with measurements of hysteresis on a number of samples.

FIG. 3 shows the results of hysteresis measurements performed on samples. At a certain applied magnetic field H, there is a difference in the measured field B when the field H is swept up or swept down. This difference is reported as "hysteresis".

Figure 4A:
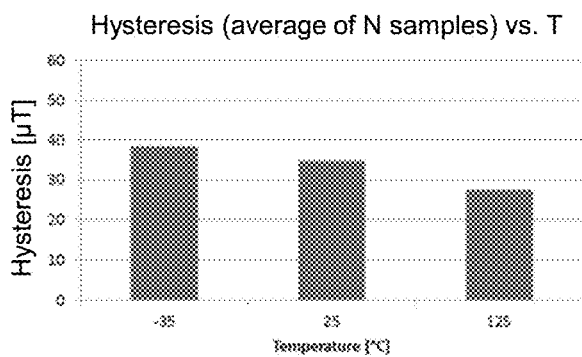
FIGS. 4a and 4b show a comparison of hysteresis measurements versus temperature for test-samples without an elastomeric material on top of the IMC (FIG. 4a), and for test samples with an elastomeric material on top of the IMC (FIG. 4b).

FIG. 4(a) shows the result of the hysteresis measurements versus temperature for a number of test-samples where an elastomeric material (polyimide) was applied underneath the magnetic alloy, but not on top of the magnetic alloy.

Figure 4B:
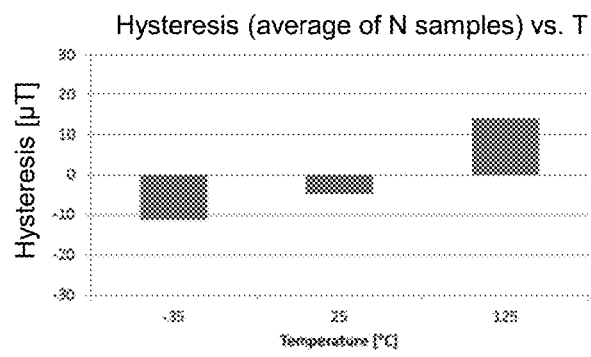

FIG. 4(b) shows the result of hysteresis measurements versus temperature for similar test-samples, except that an elastomeric material (polyimide) was also applied on top of the magnetic alloy.

As can be seen, the hysteresis of the samples of FIG. 4(b), is considerably smaller, and less temperature dependent than the hysteresis of the samples of FIG. 4(a).

For completeness, it is mentioned that the annealing was done in a magnetic field with a fixed orientation (non-rotating), and the samples were electroplated).

Figure 5:
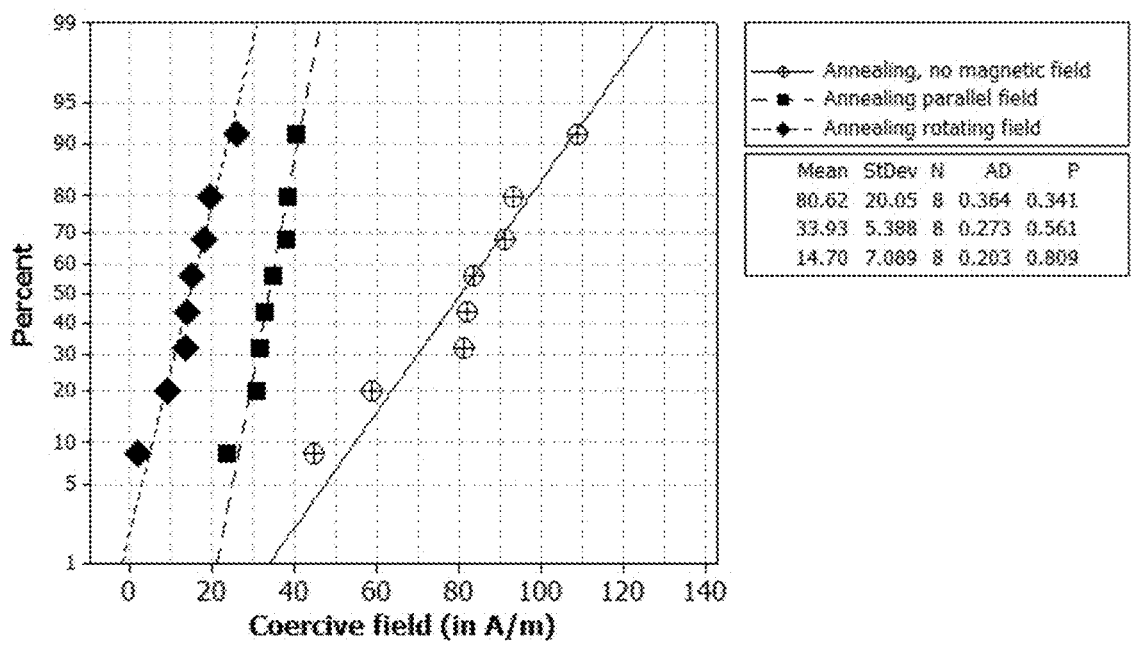
FIG. 5 shows three cumulative distribution plots, illustrating the effect of annealing without the presence of a magnetic field (circles), annealing in the presence of a constant magnetic field (squares), annealing in the presence of a magnetic field which is rotating relative to the samples (diamonds).

FIG. 5 shows three cumulative distribution plots (as almost straight lines), illustrating the effect of:
annealing without the presence of a magnetic field (circles),
annealing in the presence of a constant magnetic field (squares), and
annealing in the presence of a magnetic field which is rotating relative to the samples (diamonds).

The elastomeric material used was polyimide. The composition of the magnetic material was Ni79Fe21, and this material was electroplated. The annealing was performed at 290° C. for 2 hours with a 200 mT magnetic field.

As can be seen, annealing in the presence of a stationary magnetic field oriented parallel to the substrate had the effect of reducing the coercivity from about 80 A/m (average over 8 samples) to about 34 A/m (on average), that is more than a factor of 2 improvement. And annealing in the presence of a rotating magnetic field in a plane oriented parallel to the substrate had the effect of reducing the coercivity from about 80 A/m (on average) to about 15 A/m (on average). That is an improvement by a factor of 5, which is huge. The rotation speed used during these tests was about 1 rotation per 7 seconds, but another rotation speed, higher or lower than 1 rotation per 7 seconds can of course also be used. In total, the device was rotated about 1000 times with respect to the magnetic field, but it is contemplated that a number of rotations higher than 200, or higher than 100 may already provide a measurable improvement.

FIG. 6 shows an example of a sensor device 600 according to an embodiment of the present invention. In the example shown, the magnetic layer is deposited by electroplating.

The electroplating liquid may contain Boric acid, which offers the advantage of making the deposits smoother. The fact that there is Boron in the electrolyte and that it is deposited together with the compound, gives the opportunity to increase the annealing temperatures without affecting the small grain size too much. A big grain size would also result in higher hysteresis.

The device comprises a substrate 601, for example a semiconductor substrate with magnet sensors 602 such as e.g. Hall plates. The substrate may be a CMOS substrate and can optionally comprise further circuitry. On top of the substrate 601 of first elastomeric layer, e.g. an elastomeric base layer of 4 μm polyimide is applied, e.g. by spin coating. On top of the first elastomeric layer, an adhesion layer 606, e.g. 40 nm sputtered TiW layer is applied. On top of the adhesion layer and electrically conductive layer 607, e.g. 200 nm Cu is applied, for example by sputtering, which can be used as seed layer for subsequent electroplating. On top of the seed layer, a layer of soft magnetic material (e.g. 20 μm NiFe) can be applied. A second elastomeric material or compound 605 is deposited on top of the soft magnetic layer 604 so as to completely encapsulate the soft magnetic material.

In an alternative embodiment, the magnetic layer 604 is deposited by sputtering instead of by electroplating. In this case, the adhesion layer 606 and the electrically conductive seed layer 607 can be omitted, and the magnetic material or magnetic alloy 604 can be sputtered directly upon the first elastomeric layer 603.

Although the experiments mentioned in this document only refer to FeNi alloy, it is contemplated that the same advantageous effects are obtained also for any other soft magnetic alloys, in particular Co—Ni alloy, or Fe—Co—Ni alloy, and Fe—Co alloys.

Although not explicitly mentioned above, the shape of the magnetic alloy layer as seen in the height direction (perpendicular to the substrate surface) may be substantially planar, or may be bended or may be undulating, etc. Such undulations may decrease mechanical stress of the magnetic alloy even further.

The invention claimed is:

1. A method of producing a sensor device, comprising the steps of:
   a) providing a substrate comprising one or more magnetic sensor elements;
   b) depositing a first elastomeric material on top of the one or more magnetic sensor elements;
   c) applying a magnetic layer comprising a soft magnetic metal alloy on top of the first elastomeric material by electroplating or by sputtering;
   further comprising step d) following step b), and before or after step c) of:
   d) depositing a second elastomeric material on top of the magnetic layer, wherein step c) comprises arranging the soft magnetic alloy as an Integrated Magnetic Concentrator (IMC),
   further comprising step e) following step c), and before or after step d) of:
   e) annealing the substrate with the magnetic layer at a temperature in the range from 250° C. to 370° C. for a duration in the range of 10 minutes to 24 hours in the presence of a magnetic field having an intensity that at least partially saturates the soft magnetic metal alloy.

2. The method of claim 1, wherein step a) comprises providing a substrate comprising one or more embedded sensor elements to form horizontal Hall elements.

3. The method of claim 2, in which step c) comprises arranging and configuring the soft magnetic alloy to bend the magnetic flux from a horizontal direction parallel to the surface of the substrate towards a vertical direction perpendicular to said surface in the vicinity of the magnetic sensor elements.

4. A method according to claim 3, wherein step b) comprises providing a material or compound selected from the group consisting of polyimide, PDMS, PBO, WPR, epoxy as the first elastomeric material; and/or
   wherein step d) comprises providing a material or compound selected from the group consisting of polyimide, PDMS, PBO, WPR, epoxy as the second elastomeric material.

5. A method according to claim 3, further comprising providing a conductive layer above at least a portion of the substrate; and
   wherein step c) comprises applying the magnetic layer by electroplating, wherein at least a portion of the magnetic layer is electroplated to at least a portion of the conductive layer.

6. A method according to any of the claim 3, wherein step c) comprises applying the magnetic layer by sputtering.

7. A method according to claim 1, wherein step e) comprises annealing using a magnetic field strength in the range from 150 mTesla to 250 mTesla.

8. A method according to claim 1, wherein step e) comprises annealing in the presence of a constant magnetic field.

9. A method according to claim 1, wherein step e) comprises annealing in the presence of a magnetic field that is rotating relative to the substrate.

10. A method according to claim 9, wherein step e) comprises generating the magnetic field by means of one or more permanent magnets, and rotating the substrate with the magnetic alloy relative to the one or more permanent magnets, or vice versa.

11. The method according to claim 5, wherein the conductive layer is provided on top of at least a portion of the first elastomeric material.

12. The method according to claim 5, wherein the first elastomeric material is arranged between the conductive layer and the substrate.

13. The method according to claim 5, further comprising providing an adhesion layer between at least a portion of the first elastomer material and the conductive layer.

14. A method according to claim 1, wherein step e) comprises annealing at a temperature of about 290° C. or about 300° C. or about 310° C., during about 1.5 hours or about 2.0 hours or about 2.5 hours, in the presence of a field of about 150 or about 175 or about 200 or about 225 or about 250 m Tesla at, in any combination thereof.

* * * * *